United States Patent
Yuan et al.

(10) Patent No.: US 8,245,163 B1
(45) Date of Patent: Aug. 14, 2012

(54) PARTIAL COMPILATION OF CIRCUIT DESIGN WITH NEW SOFTWARE VERSION TO OBTAIN A COMPLETE COMPILED DESIGN

(75) Inventors: Jinyong Yuan, Cupertino, CA (US); Ee Ling Ooi, Ipoh (MY); Chai Pin Chew, Penang (MY)

(73) Assignee: Altera Corporation, San Jose, CA (US)

( * ) Notice: Subject to any disclaimer, the term of this patent is extended or adjusted under 35 U.S.C. 154(b) by 708 days.

(21) Appl. No.: 12/178,526

(22) Filed: Jul. 23, 2008

(51) Int. Cl.
 *G06F 17/50* (2006.01)
(52) U.S. Cl. ................................................ 716/104
(58) Field of Classification Search .......... 716/101–104, 716/106–108, 113, 116, 117
See application file for complete search history.

(56) References Cited

U.S. PATENT DOCUMENTS

| | | | |
|---|---|---|---|
| 6,263,483 B1 * | 7/2001 | Dupenloup | 716/104 |
| 6,470,482 B1 * | 10/2002 | Rostoker et al. | 716/102 |
| 7,328,420 B1 * | 2/2008 | Datta et al. | 716/102 |
| 2002/0144212 A1 * | 10/2002 | Lev et al. | 716/1 |
| 2004/0243384 A1 * | 12/2004 | Chen et al. | 703/23 |
| 2005/0183052 A1 * | 8/2005 | Ash-Rafzadeh | 716/8 |
| 2006/0184350 A1 * | 8/2006 | Huang et al. | 703/26 |
| 2006/0248493 A1 * | 11/2006 | Osann, Jr. | 716/16 |

\* cited by examiner

*Primary Examiner* — Vuthe Siek
(74) *Attorney, Agent, or Firm* — Womble Carlyle Sandridge & Rice LLP (57) ABSTRACT

Methods, computer programs and systems for using two software programs to generate a compiled design for an integrated circuit (IC) are provided. The method compiles a first IC design using a first design program and then migrates the first IC design to a second IC design, still using the first design program. Additionally, the method performs synthesis and analysis on the second IC design, still using the first design program. A second design program is used to import compile information associated with the compiling of the first IC design and the synthesis and analysis of the second IC design. The second design program is also used to create a compiled design for the second IC based on the imported compile information.

20 Claims, 6 Drawing Sheets

PARTIAL COMPILATION OF CIRCUIT DESIGN WITH NEW SOFTWARE VERSION TO OBTAIN A COMPLETE COMPILED DESIGN

BACKGROUND

The present invention describes methods for migrating a software design tool to a new version of the tool, and more specifically, methods, computer programs and systems for using information obtained with the older version of the design tool to shorten the time required to obtain a compiled design with the new design tool.

Structured application-specific integrated circuits (ASIC) are sometimes used as alternatives to programmable logic devices (PLD) such as field-programmable gate arrays (FPGA). An FPGA has a generic structure that may include many identical blocks of logic circuitry, many registers, and a number of other types of circuit blocks such as I/O blocks, RAM blocks, DSP blocks, PLL/DLL blocks, etc. These various circuitries are programmable to perform any of a variety of tasks. An FPGA also has a generic interconnection structure. This structure is programmable to interconnect the other circuitries on the device in any of many different ways. The logic blocks of such an FPGA may be referred to as logic elements, logic modules, adaptive logic elements, or adaptive logic modules ("LEs", "LMs", "ALEs", or "ALMs").

A structured ASIC has a generic structure that includes many identical instances of a relatively simple circuit block (a so-called hybrid logic element or "HLE"). The structured ASIC may also generically include other blocks that are comparable to the special-purpose blocks on a related FPGA (e.g., I/O blocks, RAM blocks, PLL/DLL blocks, etc.). Efficient and reliable conversion from FPGA designs to structured ASIC designs, and vice versa, can be beneficial in a variety of contexts. For example, after an FPGA implementation of a design has been in use for awhile, a user may desire to migrate that design to a functionally equivalent ASIC in order to lower unit costs. As another example, the user may desire to use an FPGA to prototype a design that is intended for ASIC implementation. Again, the FPGA and ASIC must be functionally equivalent for such prototyping to be meaningful.

Circuit developers use different PLDs in the different stages of development depending on the time required to program the PLDs and the volume desired. Because of the relationship between these PLDs, circuit design tools leverage some of the information obtained in the compilation of the PLD, to obtain a compiled design for the other PLD in the family.

The problem of having to compile designs for two different PLDs gets accentuated when the circuit designer rolls the circuit design to a new version of software. Typically, new compilations for the circuit designs are required due to the changes in the software, such as the newer versions of the libraries used by the software. Taking into account that some of the larger designs may require days, or even weeks to be compiled, rolling a new software version and having to recompile all the designs entails a large amount of work and production delays.

It is in this context that embodiments of the invention arise.

SUMMARY

Embodiments of the present invention provide for methods, computer programs and systems for using two software programs to generate a compiled design for an integrated circuit (IC). It should be appreciated that the present invention can be implemented in numerous ways, such as a process, an apparatus, a system, a device or a method on a computer readable medium. Several inventive embodiments of the present invention are described below.

In one embodiment, a method for using two software programs to generate a compiled design for an integrated circuit (IC) is provided. The method compiles a first IC design with a first design program and migrates the first IC design to a second IC design, also using the first design program. Further, a synthesis and analysis is performed on the second IC design, still with the first design program. The method imports compile information associated with the compiling of the first IC design and with the synthesis and analysis of the second IC design. The import operation is performed by a second design program. The second design program is also used to create a compiled design for the second IC using the imported compile information and performing a partial compilation. In one embodiment, the method operations may be performed by a computer program embedded in a computer-readable storage medium.

In another embodiment, a system to generate a compiled design for an integrated circuit (IC) using two software programs is presented. The system includes a computer device having a processor, a memory, and a display to show results generated by two IC design programs. The memory includes a first design program, a second design program, a Hardware Description Language (HDL) circuit design, and storage for information generated by the first and the second IC design programs. The program instructions from the first IC design program when executed by the processor cause the processor to compile a first IC design, to migrate the first IC design to a second IC design, and to perform synthesis and analysis on the second IC design. The program instructions from the second IC design program when executed by the processor cause the processor to import compile information associated with the compiling of the first IC design and the synthesis and analysis of the second IC design, and to create a compiled design for the second IC using the imported compile information.

Other aspects of the invention will become apparent from the following detailed description, taken in conjunction with the accompanying drawings, illustrating by way of example the principles of the invention.

BRIEF DESCRIPTION OF THE DRAWINGS

The invention may best be understood by reference to the following description taken in conjunction with the accompanying drawings in which.

DETAILED DESCRIPTION

Methods, computer programs and systems for using two software programs to generate a compiled design for an integrated circuit (IC) are provided. The method compiles a first IC design using a first design program and then migrates the first IC design to a second IC design, still using the first design program. Additionally, the method performs synthesis and analysis on the second IC design with the first design program. The method then continues by using a second design program to import compile information associated with the compiling of the first IC design and the synthesis and analysis of the second IC design. The second design program is also used to create a compiled design for the second IC using the imported compile information.

Consequently, substantial compile-time savings are achieved when migrating to a new version of design software by not having to perform a complete compilation of the circuit design with the new design software and by using the compile information generated with the first design software.

In one embodiment, the first design is for programming an FPGA while the second design is for programming a Structured ASIC associated with the FPGA. In another embodiment, the first design is for a structured ASIC and the second design is for an FPGA. For simplicity, an FPGA will be used for the first design and a structured ASIC will be use for the second design in the description of the embodiments that follow. However, the same concepts described herein apply to any combination of related PLDs, such as the inverse case when the first design is a structured ASIC, and the second design is for an FPGA.

Embodiments of the invention allow a user to continue using a compilation of a PLD design when upgrading to a new version of a design tool, or when patching an existing version. By reusing the existing compilation database, the embodiments allow the user to seamlessly upgrade to a new version of software without having to recompile the prototype design. This shortens the overall compilation time, which can be up to a few weeks in large designs.

It will be obvious, however, to one skilled in the art, that the present invention may be practiced without some or all of these specific details. In other instances, well known process operations have not been described in detail in order not to unnecessarily obscure the present invention.

Figure 1:
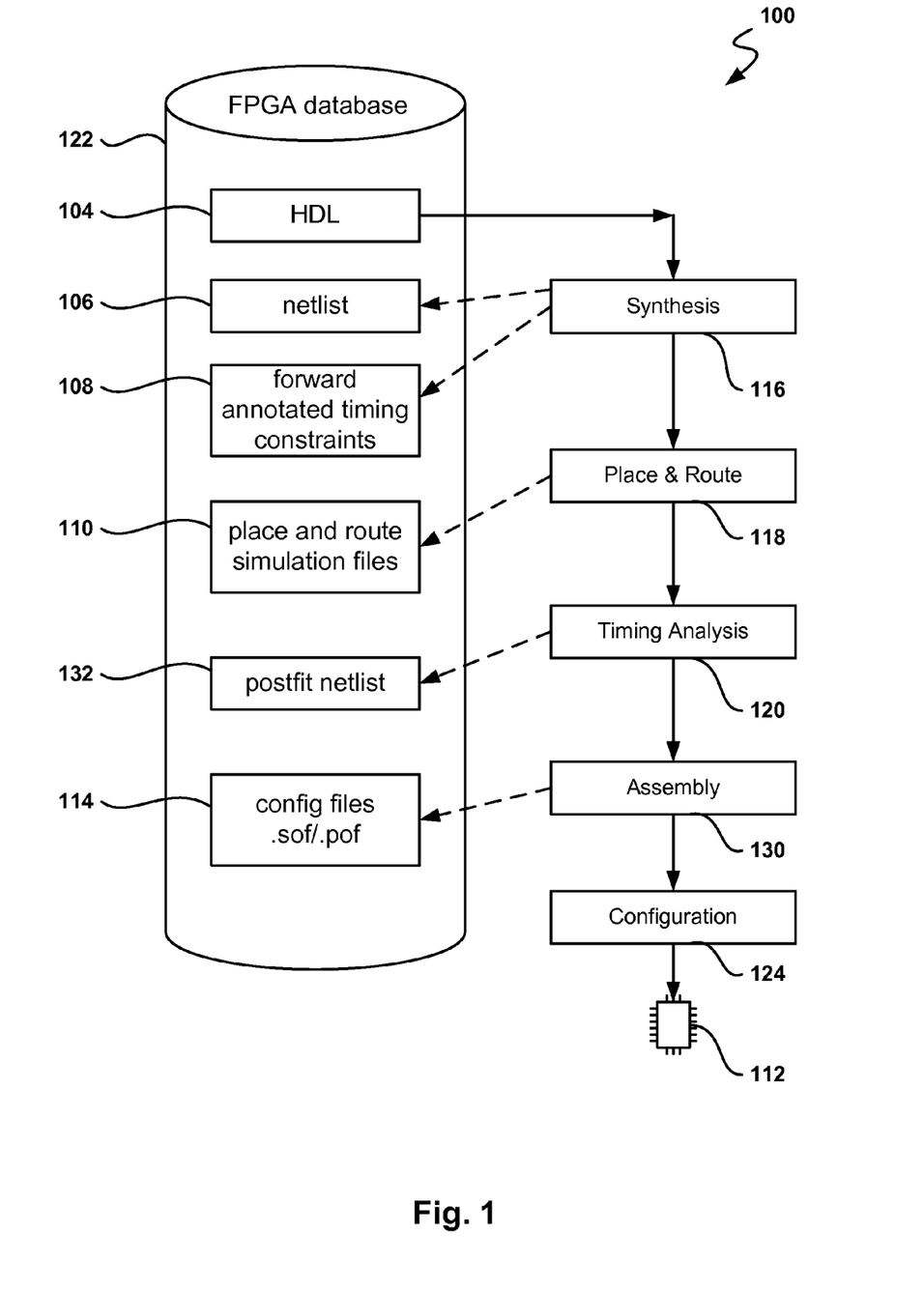
FIG. 1 shows the compilation process to create a compiled design for an FPGA using a CAD tool.

FIG. 1 shows compilation process 100 to create a compiled design for an FPGA using a CAD tool. The process starts with an IC design produced by a hardware engineer and embodied in HDL files 104 containing the desired circuitry description. During synthesis 116, HDL files 104 are parsed and a basic discrete netlist 106 of logic-gate primitives are created, which is then optimized. Synthesis 116 also generates forward annotated timing constraints 108. Synthesis is typically divided into phases and steps within the phases. At any point in time during synthesis, the circuit representation is complete, self-contained and equivalent to the HDL design. Most operations are optional, in the sense that the operation's removal will not stop the CAD tool from reaching a solution. However, the solution quality may be impacted from removal of the optional operations.

Place and route 118, timing analysis 120 and assembly 130 operations follow synthesis 116. Place and route simulation files 110 are generated during place and route 118 operation. After place and route 118, timing analysis 120 assigns delays to the different gates and wires in the circuit, and creates postfit netlist 132. Timing analysis 120 computes the lengths of paths in the circuits and how the delays relate to the constraints of the circuit. During assembly 130, the CAD tool produces binary configuration files 114 with a description of the circuit to be used during device programming 124 of electronic device 112. The resulting binary file 114 can be stored in non-volatile memory for later retrieval during the device 112 programming process. The different files created during the compilation of the device are kept in FPGA database 122.

A compilation of structured ASIC follows the same basic operations. In some cases, the compilation of the structured ASIC is independent from the compilation of the FPGA. However, in other cases, the compilation of the structured ASIC by a design tool relies on information obtained during the compilation of the FPGA. In other words, the compilation of the structured ASIC depends on the compilation of the related FPGA. This means that if a user compiles an FPGA design with a version of a CAD tool, then the user cannot use a different version to obtain a compiled version for the structured ASIC.

Typically, a user creates a project targeted to an FPGA device first. Once the user has a working design for the FPGA, the design is compiled. When the compilation is successful, the FPGA design is migrated to a structured ASIC design. During migration, the CAD tool creates a new revision, sometimes called a companion revision, of the prototype design with the structured ASIC as the targeted device. The newly created structured ASIC revision is compiled, revisions are compared, and a structured ASIC handoff report is generated.

The reverse scenario is also possible. For example, it may be difficult to fit a design in the structured ASIC due to availability of resources. In this scenario, the user first creates a design for the structured ASIC. After compiling the design for the structured ASIC and creating a first revision, the design is migrated to a compatible design for an FPGA. Similarly, the CAD tool creates a new revision of the original design with the FPGA as the targeted device. The newly created FPGA revision is compiled before doing a revision compare and generating the structured ASIC handoff report.

Often users with fairly complex designs need up to six weeks, or even more, to requalify their FPGA device whenever the users upgrade to the latest CAD release or when the users apply patches to their current CAD application. The operation that usually takes the longest is the place and route operation. In one embodiment, a new compilation flow allows the reuse, by the new software tool, of information obtained during FPGA compilations with an older version of software, as long as the database is intact. Once users compile the FPGA revision and migrate the design to a compatible ASIC device, users have the flexibility to upgrade or update their CAD application and continue with the rest of the compilation flow without having to recompile the prototype design all over again. Importing the database from the previous compilation is needed before continuing with the ASIC compilation flow in the newer version of software.

Figure 2:
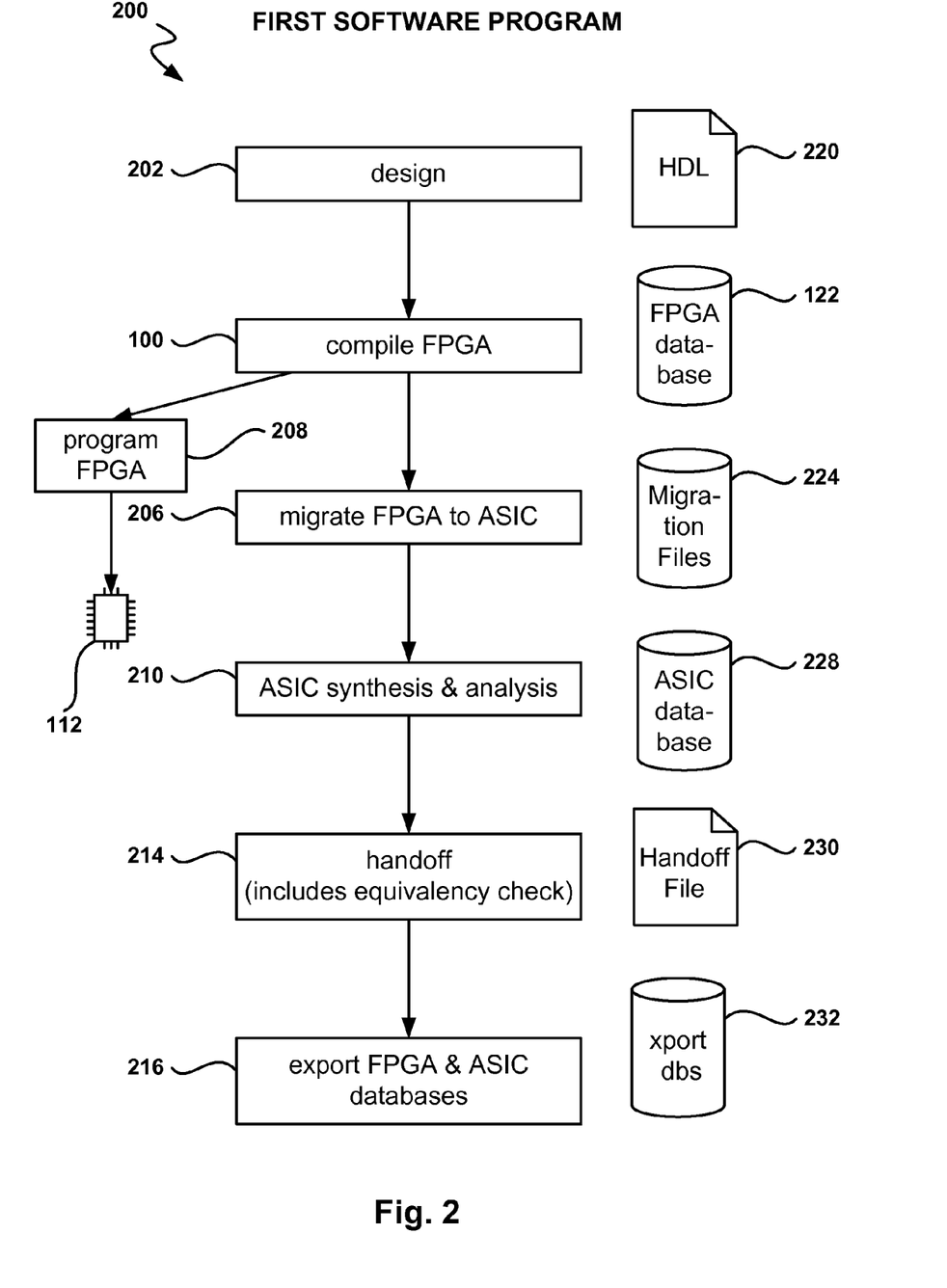
FIG. 2 describes the process performed using a first software version to facilitate rapid compilation of a design using a second software version, in one embodiment of the invention.

FIG. 2 describes process 200 performed using a first software version to facilitate rapid compilation of a design 220 using a second software version, in one embodiment of the invention. During design phase 202, a design engineer creates HDL design file 220. Users compile 100 their FPGA prototype design as usual, as seen in FIG. 1, and an FPGA database 122 is generated. At this point, FPGA 112 can be programmed 208 with the compiled design. After the project has been successfully compiled, the CAD tool is used again to create a Structured ASIC companion revision for the prototype. A migration 206 generates migration files 224, including new revisions for the ICs, which will be used by the second version of the CAD tool to create a new compiled design without having to perform all the operations in a general IC compilation. More details for the migration operation are given below with respect to FIG. 3. In operation 210, instead of performing a full compilation on the Structured ASIC revision, only synthesis and analysis on the Structured ASIC companion revision is needed, and an ASIC database 228 is created.

Handoff 214 includes an equivalence check between the FPGA and the ASIC designs. A handoff file 230 is generated during handoff 214 operation. Afterwards, both the FPGA and the Structured ASIC compilation results are exported 216 to two separate databases 232. In one embodiment, each database is saved in one file or folder, and in another embodiment, the databases are saved in the same file or folder. By migrating and exporting the ASIC map database, the same mapping file is used for both revisions. A user can now upgrade to a new CAD tool without having to start compilations from the beginning.

Figure 3:
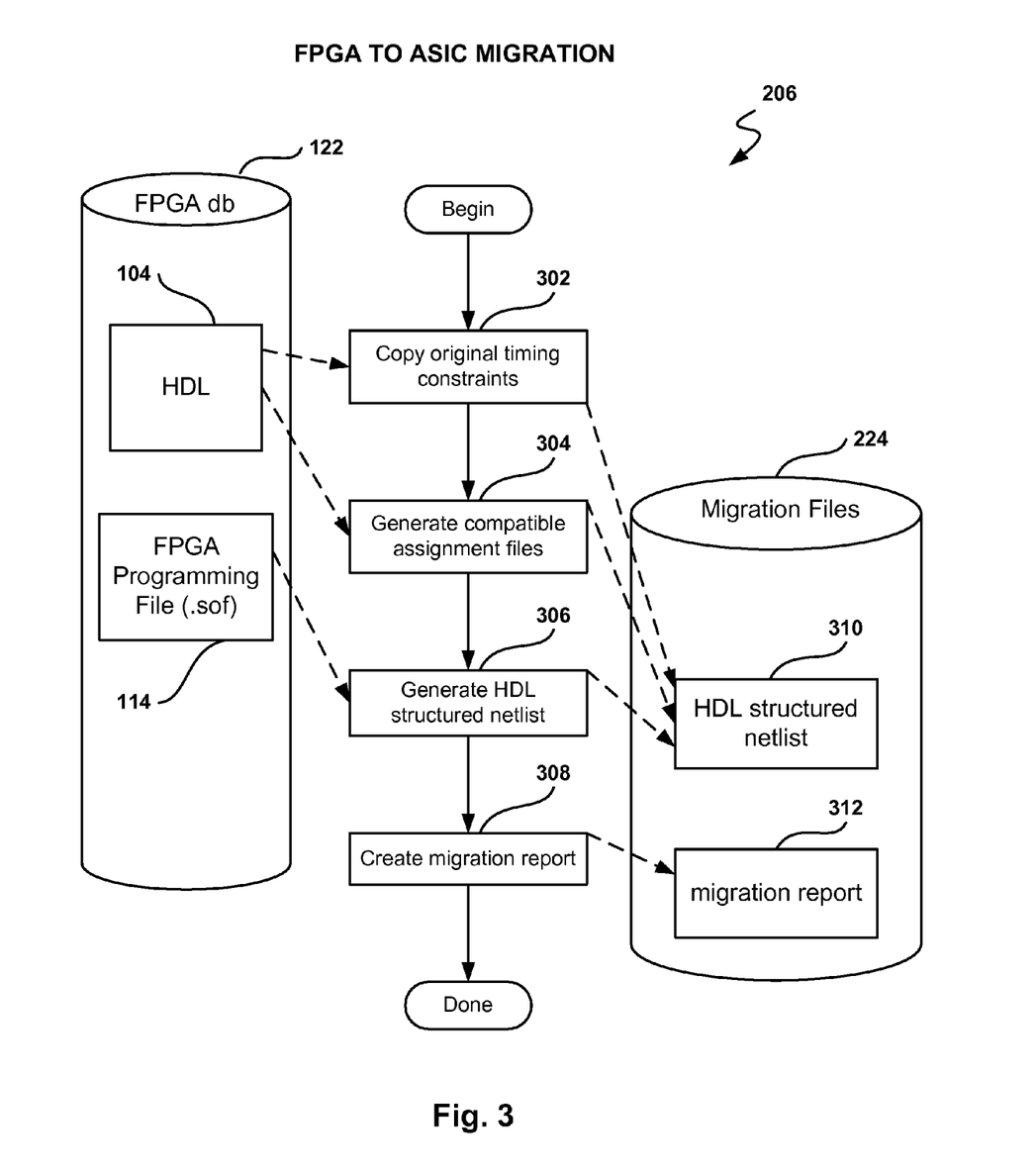
FIG. 3 describes the process to migrate an FPGA design to a structured ASIC design using a CAD tool, according to one embodiment.

FIG. 3 describes the process to migrate an FPGA design 104 to a structured ASIC design using a CAD tool, according to one embodiment. Migration 206 is not a full compilation. Basically, migration 206 creates another revision of the original design. Migration 206 generates the necessary files before starting with an ASIC compilation, assuming the user started with an FPGA design. Migration 206 uses data from FPGA database 122 and stores migration files 224 for later use by the second CAD tool. In operation 302, copy is made of the original timing constraints for the FPGA design, and in operation 304 compatible assignment files are created, which include different types of assignments, such as pin assignments, based on the assignments of the original design. A structured HDL netlist 310 is generated in operation 306 using FPGA database 122, which includes programming files 114. A migration report 312 is created during operation 308 to indicate that a device migration took place.

Figure 4:
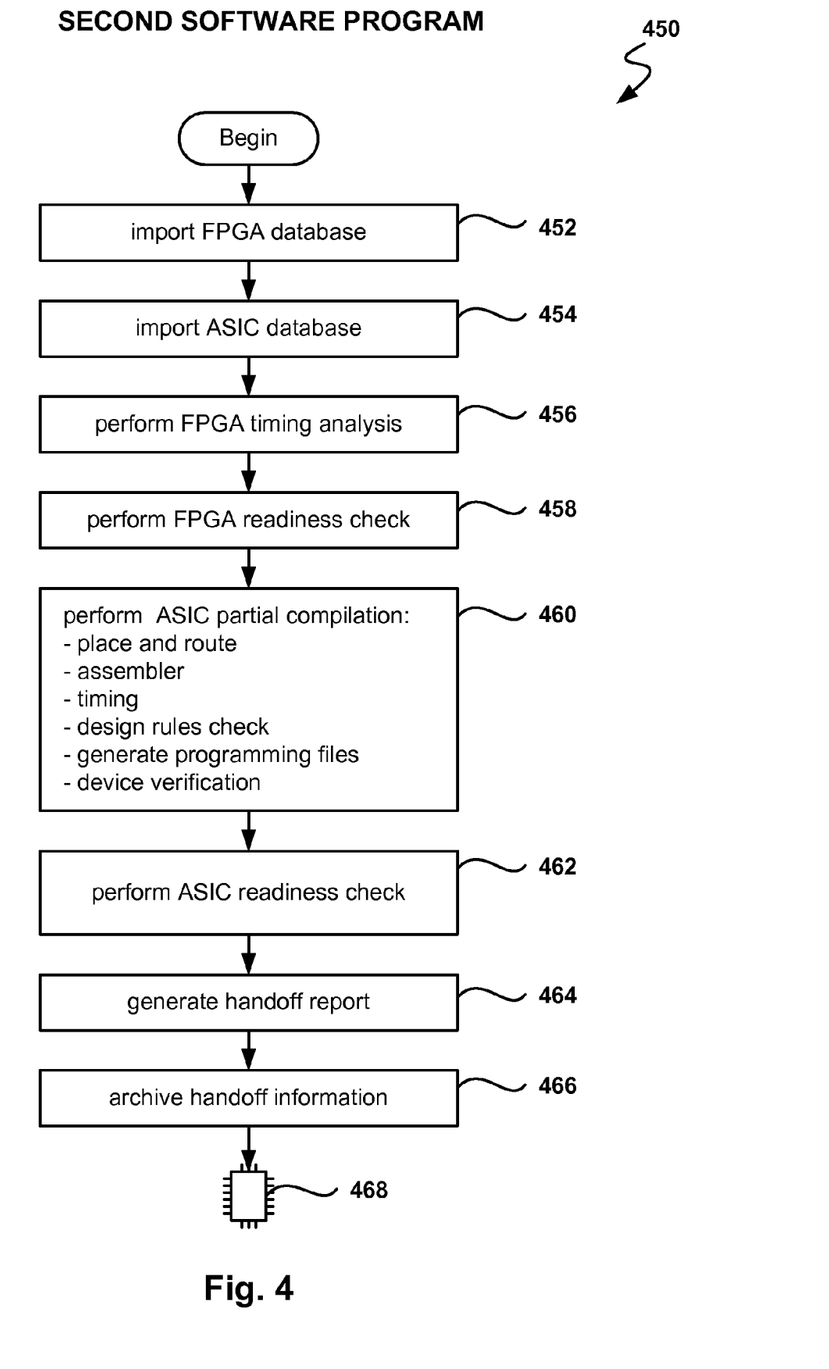
FIG. 4 depicts the operations performed by the second software version to obtain a compiled design for a PLD.

FIG. 4 depicts the operations performed by the second software version to obtain a compiled design for a PLD. In operations 452 and 454, the FPGA and Structured ASIC databases obtained with the first CAD version are imported. The timing analyzer on the FPGA revision is run in order to update all the assignments in operation 456. An FPGA design readiness check is performed in operation 458. The readiness check makes sure that all limitations and recommendations for the companion structured ASIC are met. In operation 460, a partial compilation of the structured ASIC design takes place. The partial compilation includes, place and route, assembler, timing, design rules check, programming files generation, and device verification operations.

In operation 462, a structured ASIC design readiness check is performed before generating the handoff report 464. The handoff report includes an ASCII file with all the operations taken during compilation by the user, and other files generated during the compilation process. The handoff report is archived in operation 466 and then sent to the ASIC manufacturer, which does analysis before programming the structured ASIC 468.

It should be noted, that some of the operations shown in FIG. 4 are optional in some compilations. In one embodiment, operations 458 and 462 are not performed during compilation. Additionally, the processes described in FIGS. 3 and 4 will vary slightly according to the features of the two versions of software. For example, if the first software version does not include a readiness check and the second software version does, the user has the option of skipping the readiness check when using the second software version.

Figure 5:
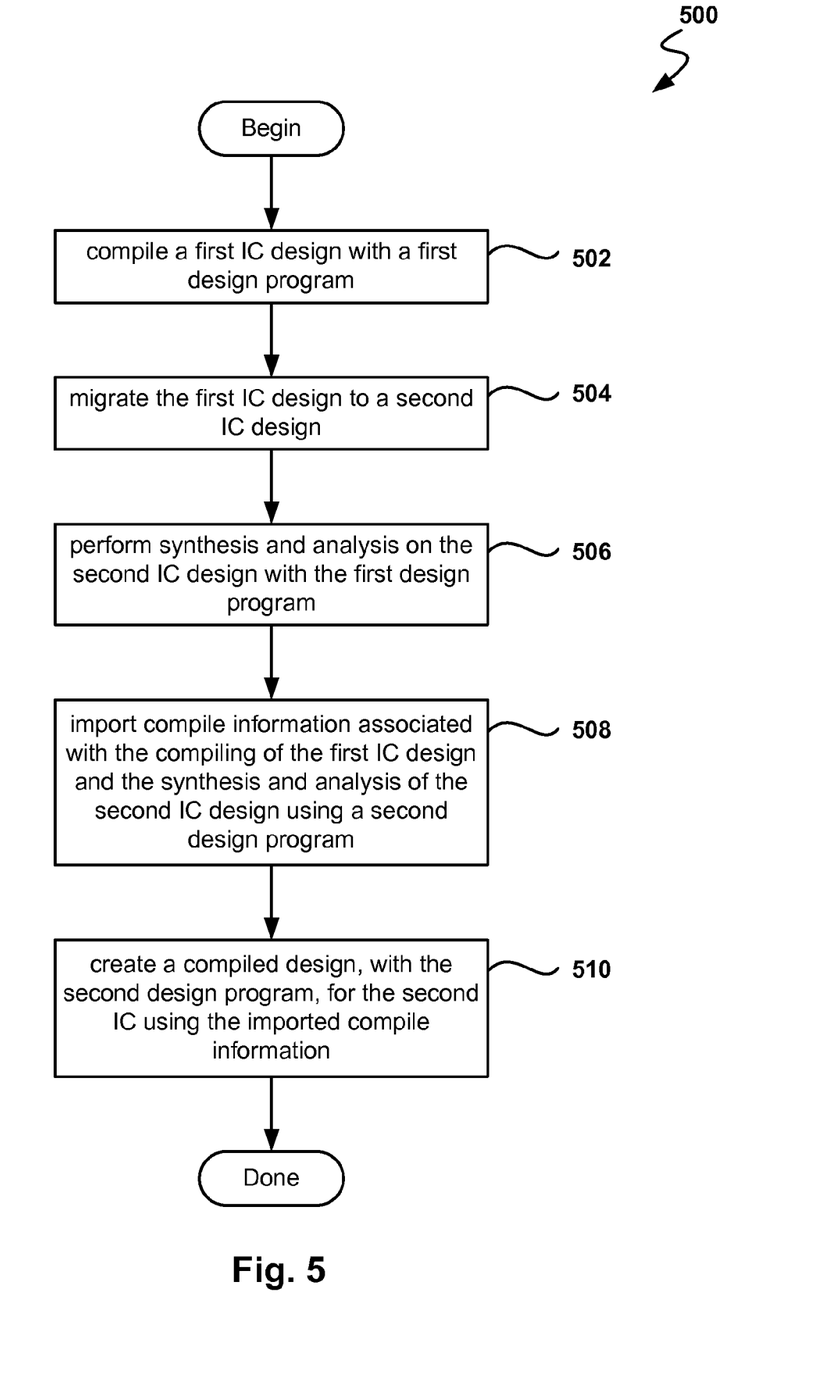
FIG. 5 shows a process flow for using two software programs to generate a compiled design for an IC in accordance with one embodiment of the invention.

FIG. 5 shows process flow 500 for using two software programs to generate a compiled design for an IC in accordance with one embodiment of the invention. In operation 502, a first IC design is compiled with a first design program.

In one embodiment, the compilation 100 is for an FPGA design in HDL format 104, as described in FIG. 1. In operation 504, the first IC design is migrated to a second IC design. In one scenario, the first design is for an FPGA and the second design is for a companion structured ASIC design. In other embodiments, the reverse operation is also possible. FIG. 3 details the migration process according to one embodiment of the invention.

Synthesis and analysis on the second IC design is performed in operation 506 using the first design program. In operation 508, the compile information associated with the compiling of the first IC design and the synthesis and analysis of the second IC design is imported using the second design program. The compile information includes FPGA database 122 of FIG. 1, migration files 224, ASIC database 228, handoff file 230 and export databases 232. Some embodiments only use a subset of the aforementioned compile information files. A compiled design for the second IC is created in operation 510 using the imported compile information and the second design program. FIG. 4 depicts the operations performed with the second software tool according to one embodiment. Process flow 500 can be streamlined by creating scripts that automate all the operations contained within process 500, in one embodiment.

Figure 6:
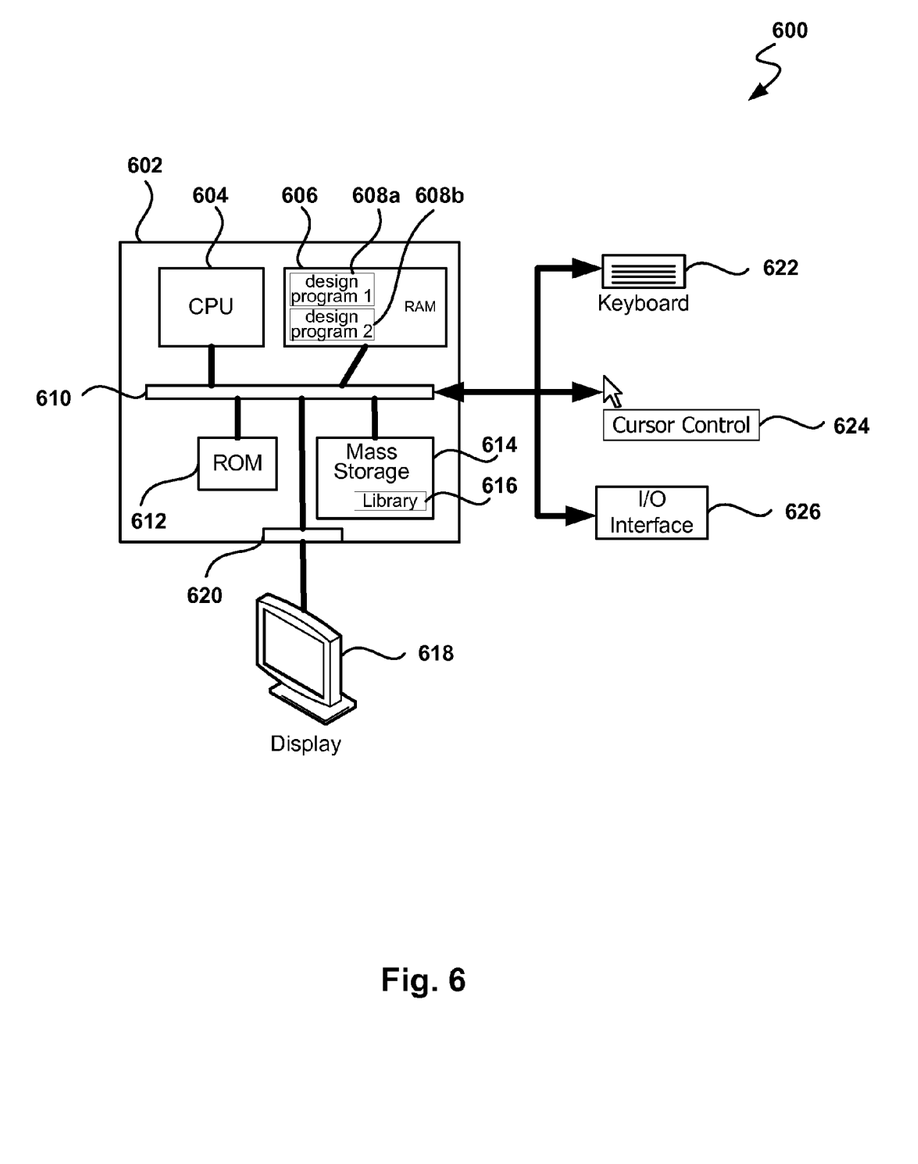
FIG. 6 is a simplified schematic diagram of a computer system for implementing embodiments of the present invention.

FIG. 6 is a simplified schematic diagram of computer system 400 for implementing embodiments of the present invention. It should be appreciated that the methods described herein may be performed with a digital processing system, such as a conventional, general-purpose computer system. Special purpose computers, which are designed or programmed to perform only one function may be used in the alternative. In addition, the computer system of FIG. 6 may be used to compile IC designs using two different design programs 608a and 608b. The computer system includes a central processing unit (CPU) 604, which is coupled through bus 610 to random access memory (RAM) 606, read-only memory (ROM) 612, and mass storage device 614. Design programs 608a and 608b reside in random access memory (RAM) 606, but can also reside in mass storage 614. In some embodiments, design program 608b is a newer software version of design program 608a. For example, design program 608b is the result of applying a patch to design program 608a, or design program 608b is a newer release of design program 608a. Embodiments of the present invention allow the use of information created with design program 608a to produce a compiled design for an IC with design program 608b, without having to perform a full compilation with design program 608b, resulting in substantial compilation-time savings.

Even though design programs 608a and 608b may have common components, both design programs are configured in order to coexist in one computer system. Or in other words, installing the newer design program 608b in a computer system with design program 608a will not cause design program 608a to become inoperable. In other embodiments, design programs 608a and 608b may not be compatible in the same machine, thus requiring performing all the operations needed with design program 608a before installing design program 608b. Alternatively, design programs 608a and 608b may reside in different computers with the ability to share information over a network or by any other means, such as using removable storage in the form of a Compact Disk (CD) or a Universal Serial Bus (USB) drive.

Mass storage device 614 represents a persistent data storage device such as a floppy disc drive or a fixed disc drive, which may be local or remote. CAD tool library 616 resides in mass storage device 614, but can also reside in RAM 606 during processing. It should be appreciated that CPU 604 may be embodied in a general-purpose processor, a special purpose processor, or a specially programmed logic device. Display 618 is in communication with CPU 604, RAM 606, ROM 612, and mass storage device 614, through bus 610 and display interface 620. Of course, display 618 is configured to display the user interfaces described herein. Keyboard 622, cursor control 624, and input/output interface 626 are coupled to bus 610 in order to communicate information in command selections to CPU 604. It should be appreciated that data to and from external devices may be communicated through input output interface 626.

Embodiments of the present invention may be practiced with various computer system configurations including handheld devices, microprocessor systems, microprocessor-based or programmable consumer electronics, minicomputers, mainframe computers and the like. The invention can also be practiced in distributed computing environments where tasks are performed by remote processing devices that are linked through a wire-based or wireless network.

Any of the operations described herein that form part of the invention are useful machine operations. The invention also relates to a device or an apparatus for performing these operations. The apparatus can be specially constructed for the required purpose, or the apparatus can be a general-purpose computer selectively activated or configured by a computer program stored in the computer. In particular, various general-purpose machines can be used with computer programs written in accordance with the teachings herein, or it may be more convenient to construct a more specialized apparatus to perform the required operations.

The invention can also be embodied as computer readable code on a computer readable medium. The computer readable medium is any data storage device that can store data, which can be thereafter be read by a computer system. Examples of the computer readable medium include hard drives, network attached storage (NAS), read-only memory, random-access memory, CD-ROMs, CD-Rs, CD-RWs, magnetic tapes and other optical and non-optical data storage devices. The computer readable medium can also be distributed over a network-coupled computer system so that the computer readable code is stored and executed in a distributed fashion.

Although the method operations were described in a specific order, it should be understood that other housekeeping operations may be performed in between operations, or operations may be adjusted so that they occur at slightly different times, or may be distributed in a system which allows the occurrence of the processing operations at various intervals associated with the processing, as long as the processing of the overlay operations are performed in the desired way.

Although the foregoing invention has been described in some detail for purposes of clarity of understanding, it will be apparent that certain changes and modifications can be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A method of generating a compiled design for an integrated circuit (IC), the method comprising:
    compiling a first IC design with a first design program, the first IC design designated for programming a first IC;
    migrating the first IC design to a second IC design using the first design program, the second IC design designated for programming a second IC, wherein the migrating comprises creating a revision of the first IC design with the second IC as a targeted device;
    performing synthesis and analysis on the second IC design with the first design program;
    importing, from the first design program, compile information associated with the compiling of the first IC design and further importing the synthesis and analysis of the second IC design, wherein the importing is performed by a second design program; and
    creating a compiled design for the second IC using the imported compile information, wherein creating the compiled design is performed by the second design program.

2. The method as recited in claim 1, wherein migrating the first IC design further includes:
    copying original timing constraints from the first IC design;
    generating compatible assignment files;
    generating a hardware description language (HDL) structured netlist; and
    creating a migration report.

3. The method as recited in claim 1, wherein creating the compiled design for the second IC further includes:
    performing a timing analysis of the first IC design;
    confirming that a functionality and timing of the first IC design and the second IC design are equivalent;
    performing a partial compilation of the second IC design;
    running a readiness check; and
    generating a handoff report that includes operations taken during compilation.

4. The method as recited in claim 3, wherein performing a partial compilation of the second IC design further includes the method operations of:
    place and route;
    timing analysis;
    programming file generation; and
    device verification.

5. The method as recited in claim 1, wherein the compile information associated with the compiling of the first IC design is created by exporting the first IC design with the first design program, wherein the compile information associated with the synthesis and analysis of the second IC design is created by exporting the second IC design with the first design program.

6. The method as recited in claim 1, wherein the first IC is a field-programmable gate array (FPGA), and the second IC is a structured application-specific integrated circuit (ASIC).

7. The method as recited in claim 1, wherein the first IC is a structured application-specific integrated circuit (ASIC), and the second IC is a field-programmable gate array (FPGA).

8. The method as recited in claim 1, wherein the second design program is a new version of the first design program, wherein the second design program uses the compile information obtained with the first design program.

9. The method as recited in claim 1, wherein the second design program is a newer revision of the first design program.

10. The method as recited in claim 1, wherein compiling the first IC design further includes a design check.

11. A computer program embedded in a non-transitory computer-readable storage medium, when executed by one or more processors, to generate a compiled design for an integrated circuit (IC), the computer program comprising:
    program instructions for compiling a first IC design with a first design program, the first IC being designated for programming a first IC;

program instructions for migrating the first IC design to a second IC design using the first design program, the second IC design designated for programming a second IC, wherein the migrating comprises creating a revision of the first IC design with the second IC as a targeted device;

program instructions for performing synthesis and analysis on the second IC design with the first design program;

program instructions for importing, from the first design program, compile information associated with the compiling of the first IC design and the synthesis and further importing analysis of the second IC design, wherein the importing is performed by a second design program; and program instructions for creating a compiled design for the second IC using the imported compile information, wherein creating the compiled design is performed by the second design program.

12. The computer program as recited in claim 11, further comprising:
an automated script to execute a plurality of the program instructions in the computer program without user intervention.

13. The computer program as recited in claim 11, wherein the compile information includes:
a netlist;
timing constraints;
placement constraints; and
routing constraints.

14. The computer program as recited in claim 13, wherein the compile information further includes:
physical and timing models;
a base layout;
test structures;
a modified netlist; and
configuration files.

15. The computer program as recited in claim 11, wherein the program instructions for migrating the first IC design further include:
program instructions for copying original timing constraints from the first IC design;
program instructions for generating compatible assignment files;
program instructions for generating a hardware description language (HDL) structured netlist; and
program instructions for creating a migration report.

16. The computer program as recited in claim 11, wherein the program instructions for creating the compiled design for the second IC further include:

program instructions for performing a timing analysis of the first IC design;
program instructions for confirming that a functionality and timing of the first IC design and the second IC design are equivalent;
program instructions for performing a partial compilation of the second IC design;
program instructions for running a design check; and
program instructions for generating a handoff report that includes all operations taken during compilation.

17. A system for generating a compiled design for an integrated circuit (IC), the system comprising:
a computer device having a processor;
a memory for storing a first design program, a second design program, a hardware description language (HDL) circuit design, and information generated by the first and the second design programs; and
a display for rendering results generated by the first and second design programs;
wherein program instructions from the first design program when executed by the processor cause the processor to
migrate a first IC design to a second IC design, wherein the processor configured to migrate the first IC design to the second IC design is further configured to create a revision of the first IC design with the second IC as a targeted device, and
perform synthesis and analysis on the second IC design, the first IC design designated for programming a first IC, the second IC design designated for programming a second IC;
wherein program instructions from the second design program when executed by the processor cause the processor to import compile information obtained with the first design program, and to create a compiled design for the second IC using a partial compilation.

18. The system as recited in claim 17, wherein the program instructions to perform synthesis and analysis on the second IC design generate a second IC design checklist.

19. The system as recited in claim 17,
wherein the first IC is a field-programmable gate array (FPGA), and the second IC is a structured application-specific integrated circuit (ASIC, wherein the FPGA is used to prototype a final implementation for the structured ASIC.

20. The system as recited in claim 19, wherein the structured ASIC includes equivalent hard intellectual property blocks to those in the FPGA.

* * * * *